United States Patent [19]

Aubert

[11] Patent Number: 4,999,600
[45] Date of Patent: Mar. 12, 1991

[54] CYLINDRICAL PERMANENT MAGNET TO PRODUCE A TRANSVERSAL AND UNIFORM INDUCTION FIELD

[75] Inventor: Guy Aubert, Grenoble, France

[73] Assignee: Centre National de la Recherche Scientifique, Paris, France

[21] Appl. No.: 353,674
[22] PCT Filed: Oct. 13, 1987
[86] PCT No.: PCT/FR87/00392
  § 371 Date: Apr. 14, 1989
  § 102(e) Date: Apr. 14, 1989
[87] PCT Pub. No.: WO88/02923
  PCT Pub. Date: Apr. 21, 1988

[30] Foreign Application Priority Data

Oct. 17, 1986 [FR] France ............................. 86 14417

[51] Int. Cl.⁵ ......................................... H01F 7/02
[52] U.S. Cl. ..................................... 335/306; 324/318
[58] Field of Search ............... 335/296, 302, 301, 306; 324/318, 319, 320

[56] References Cited

U.S. PATENT DOCUMENTS

| | | | |
|---|---|---|---|
| 3,237,059 | 2/1966 | Meyerer | 335/306 X |
| 4,538,130 | 8/1985 | Gluckstern et al. | 335/306 |
| 4,614,930 | 9/1986 | Hickey et al. | 335/302 |
| 4,658,228 | 4/1987 | Leupold | 335/304 X |
| 4,692,732 | 9/1987 | Leupold et al. | 335/304 |
| 4,701,737 | 10/1987 | Leupold | 335/301 |
| 4,703,276 | 10/1987 | Beer | 335/306 X |
| 4,706,057 | 11/1987 | Schultz | 335/304 |
| 4,707,663 | 11/1987 | Minkoff et al. | 335/306 X |

FOREIGN PATENT DOCUMENTS

| | | | |
|---|---|---|---|
| 218110 | 9/1986 | Japan | 335/306 |
| 66942 | 7/1950 | Netherlands . | |
| 447409 | 4/1976 | United Kingdom | 335/306 |

Primary Examiner—George Harris
Attorney, Agent, or Firm—Oblon, Spivak, McClelland, Maier & Neustadt

[57] ABSTRACT

Industrial problems concerning the production of a field of uniform and traverse induction are solved by providing a cylindrical magnet with magnetic blocks of which the internal magnetization is either radial or tangential to the cylinder. Such an arrangement facilitates the fabrication and the magnetization of the blocks. A radial or tangential magnetization distribution produces a transverses field only if the magnetization modulus varies respectively with the cosine or the sine of the localization angle of the block with respect to the direction of induction to be produced. By combining both structures, it is even possible to obtain a magnet having a zero bipolar moment. The variation of the magnetization modulus is obtained by providing composite magnetic bricks. They comprise plates of magnetic materials which are coupled to non-magnetic plates in a proportion dependeing on the reduction of magnetization to be achieved. Such a magnet applies to imaging by nuclear magnetic resonance in the medical field.

16 Claims, 3 Drawing Sheets

FIG_1-a
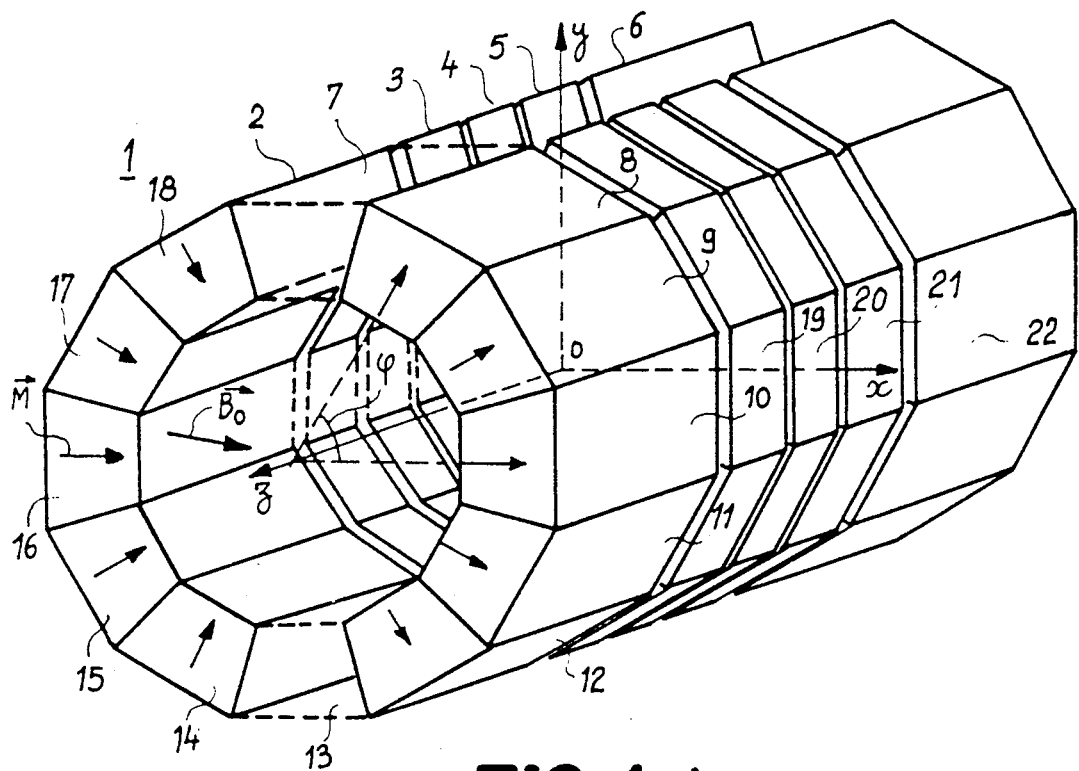
FIG_1-b
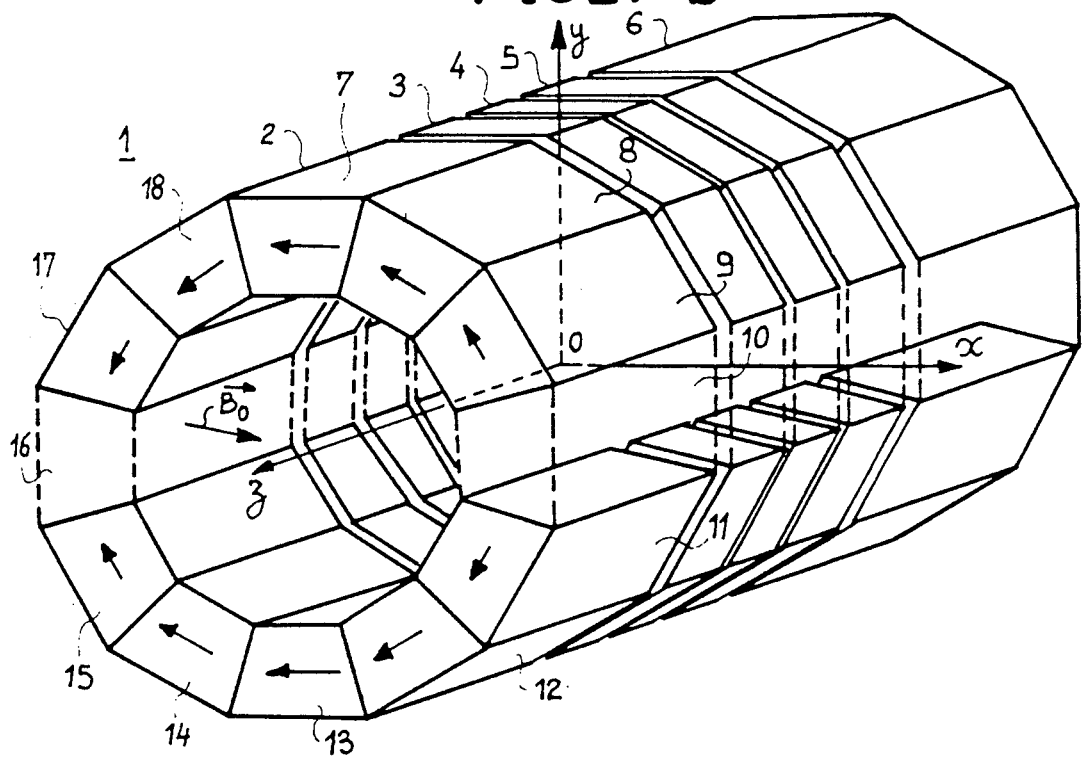

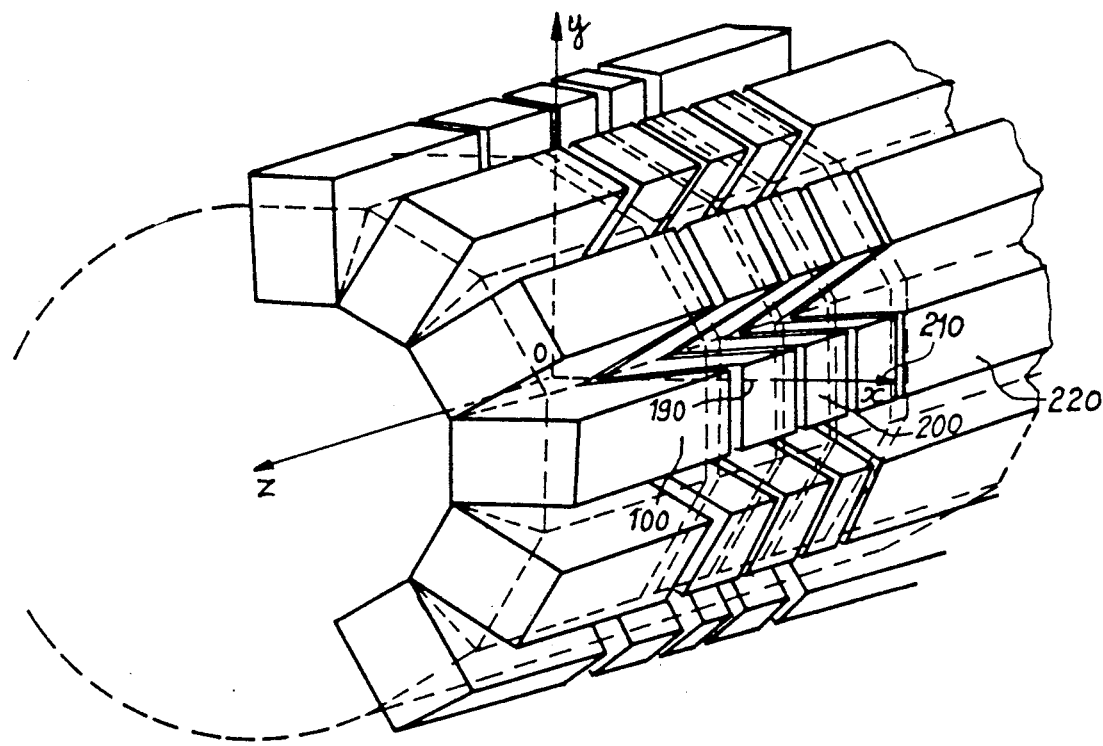
FIG_2

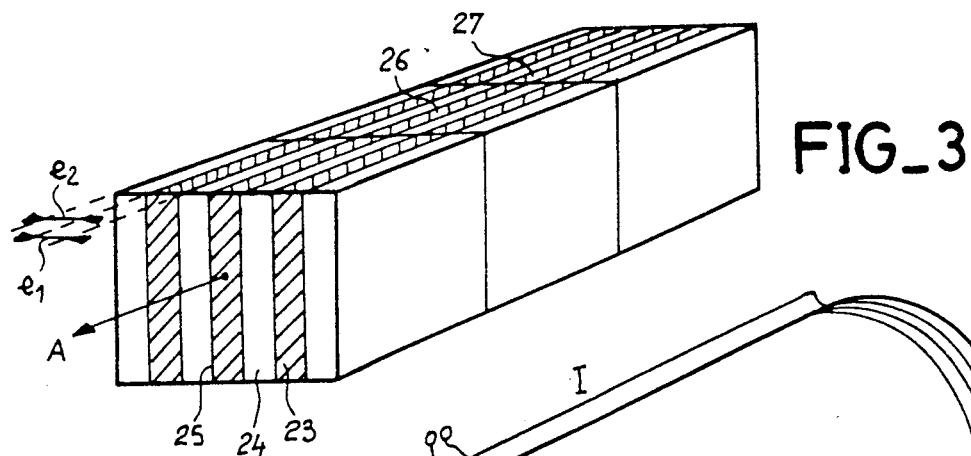
FIG_3
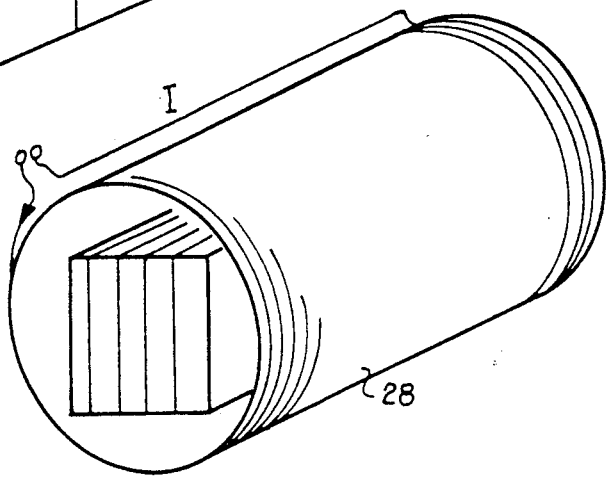
FIG_4
FIG_6
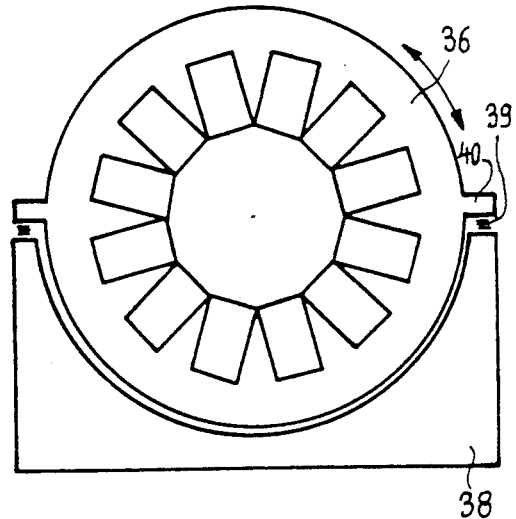
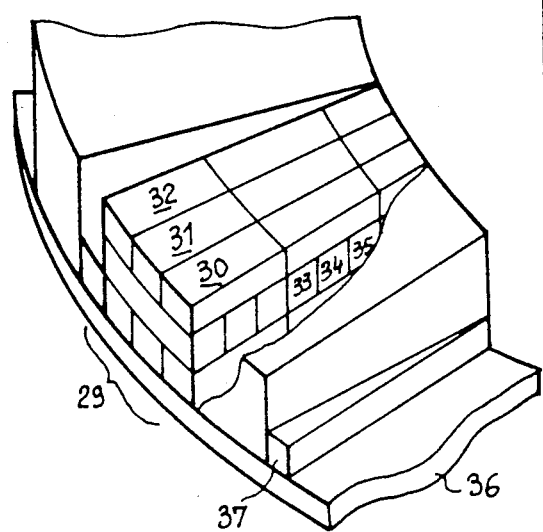
FIG_5

CYLINDRICAL PERMANENT MAGNET TO PRODUCE A TRANSVERSAL AND UNIFORM INDUCTION FIELD

The present invention is due to Mr. Guy Aubert, Director of the Service National des Champs Intenses, and its object is a cylindrical permanent magnet to produce a transversal and uniform magnetic field. It finds application particularly in the medical field where magnets are used in nuclear magnetic resonance imaging experiments. It can also find application in all fields where such distributions of a magnetic induction fields are required.

In the field of imaging by magnetic resonance, it is necessary to place the objects to be imaged, the patients, in a high magnetic induction field (usually of 0.1 to 1.5 Tesla) which is homogeneous and uniform (with a few parts per million of variation) in a large volume of interest (commonly a sphere of 50 cm diameter). Several classes of magnetic field generators have been developed until now. The main ones are: superconductive magnets, so-called resistive magnets and permanent magnets. Permanent magnets have many advantages. In particular, they require no energy supply to produce the field. They therefore do not run the risk of drift in their field value due to the drift of their supplies, or possibly of the system for discharging the dissipated heat. They therefore call for no cooling systems in particular with sophisticated regulation techniques for the flow of cryogenic fluids. Their working temperature is easily stabilized. They are furthermore particularly suited to the making of structures or systems producing a transversal main field, namely a field perpendicular to the direction in which objects, patients, are introduced into the magnet. This arrangement is highly favorable to the making of antennas receiving highly uniform and high gain resonance signals. A major difficulty in the use of permanent magnets is located, however, at the level of their industrial-scale manufacture.

Permanent magnet structures producing a transversal, uniform magnetic field in a relatively big volume have been described in the state of the art. In particular, in an international patent application No. WO 84/01226 filed on Sept. 23, 1983 and published on Mar. 29, 1984, D. Lee et al. have described a magnet of this type. In it, the cylindrical structure (theoretically of infinite length) is approximated by a stacking of a certain number of annular sections each provided with a certain number of magnetized blocks. The blocks are distributed on the rim of the rings in a polygonal architecture which reproduces, as far as possible, the circular appearance of a theoretical cylinder. To produce a field transversal to the axis of the cylinder, the magnetization in each of the blocks is constant as regards modulus and is oriented, with respect to the direction of the induction field to be produced, with an angle equal to or twice that which measures the positioning angle of the block in question with respect to the axis of this cylinder. The blocks described are, in a preferred way, prismatic volumes with trapezoidal sections.

The result of the distribution of magnetization thus recommended is that the magnetization of certain blocks has to be oriented, with respect to this block, in a direction which is parallel with none of the sides of the trapezoidal section. The making of magnetic blocks of this type therefore necessitates the use, industrially, of special magnetizers. While this use, albeit more expensive than the use of standard magnetizers, is still possible, the same is not the case for the forming of the blocks. In effect, the distribution of the magnetization imposed in the cylinder creates a demagnetizing excitation, the orientation of which is rarely parallel, in each block, to that of the magnetization. This implies, for the fabrication, the choice of so-called anisotropic magnetic materials. Now, anisotropic magnetic materials which, as it happens, have the best magnetic properties, have the drawback of being hard to machine in directions that are oblique with respect to the direction of their anisotropy. The above-mentioned patent application indicates, especially in its FIG. 5 and in the associated text, that the making of the blocks can be obtained by a stacking of elementary bricks. However, it is clear that elementary bricks of parallelepiped shape have a favored direction of magnetization which is parallel to one side of the parallelepiped. Hence the fact remains that it is difficult, on the one hand, to cut the bricks obliquely with respect to the sides of this parallelepiped or, on the other hand, to efficiently magnetize the blocks formed in directions that are oblique with respect to the sides of these parallelepipeds. Consequently, in the structure presented, certain blocks, those in the alignment of the bisectors of the four quadrants, cannot easily be magnetized. The distribution of the magnetization in this magnet further leads to a corresponding distribution of the demagnetizing excitation. This is such therein that, at places, it may be sufficient to substantially diminish the magnetization. Consequently, the theoretically calculated magnet cannot be made and the performances of the real magnet are quite removed from the ideal.

It is known by the U.S. Pat. No. 4,614,930 a structure with a radial aimentation. But this structure does not have a null dipole moment.

A magnet of this type further has other drawbacks. In particular, there is no equipment entrance possible into the interior of the zone of interest apart from the axial entrance. Finally, as shall be seen from the reading of the present description, for a homogeneity of the induction field to be attained, the magnet disclosed in the above-mentioned patent application has no optimum industrial-scale embodiment: the number of sections and the distribution of the number of blocks in the sections must comply with certain rules. And the quality of the homogeneity is lowered when they are not followed.

The invention has, as its object, the overcoming of the drawbacks referred to. It concerns a cylindrical permanent magnet to produce a transversal and uniform induction field, of the type comprising magnetized blocks with a permanent magnetization, distributed along the cylinder in annular sections arranged along the cylinder and distributed on the rim of each section, characterized in that the magnetization in the blocks is oriented radially and/or tangentially with respect to the cylinder.

The invention also has, as its object, a cylindrical permanent magnet to produce a uniform and transversal induction field, of the type comprising blocks magnetized with a permanent magnetization, distributed in a number $n_a$ of annular sections arranged along the cylinder and distributed on the rim of each section in $n_b$ blocks characterised in that $n_b$ is greater than or equal to $2(n_a+1)$.

The invention also has, as its object, a cylindrical permanent magnet to produce a transversal and uniform induction field; of the type comprising magnetized blocks with a permanent magnetization, distributed in a number $n_a$ of annular sections arranged along the cylinder and distributed on the rim of each section in a number $n_b$ of blocks, said induction field being homogeneous to an order h if $n_a$ is greater than or equal to $(h+1)/2$ and if $n_b$ is greater than or equal to $(h+3)$. The order h is defined further below in the description.

The invention will be better understood from the reading of the following description and the examination of the figures that accompany it. These figures are given purely by way of indication and in no way restrict the scope of the invention. In the different figures, the same references designate the same elements. The dimensions and proportions of the parts shown have not been maintained. The figures show:

FIGS. 1a and 1b: schematic representation of magnet structures in accordance with the invention;

FIG. 2: another possible embodiment of a magnet according to the invention;

FIGS. 3 to 6: steps in the assembly of blocks made of magnetic material to obtain a magnet in accordance with that of FIG. 2.

FIG. 1a schematically represents a magnet structure according to the invention. The shape of the magnet 1 shown is cylindrical, with an axis z, and is designed to produce a uniform induction field $B_0$ oriented along an axis x orthogonal to z. The structure 1 has a certain number of annular sections numbered 2 to 6. It is provided, on the rim of the annular sections, with a number of magnetized blocks, such as those numbered 7 to 18. According to an essential characteristic of the invention, all the magnetized blocks have the particular feature wherein their magnetization M, represented by small arrows, is radial to the cylinder with an axis z. The result thereof is that the fabrication of the magnetized blocks thereby gets facilitated. In effect, these blocks arranged tangentially to the volume of interest of the magnet always have faces oriented tangentially or radially to the cylinder. Furthermore, whereas in the state of the art cited, to obtain the transversal uniform field, the magnetization had to have an orientation which was variable (with respect to each block) and a constant value, it was discovered that a transverse field of this type could be obtained with magnetizations according to the invention if, in each block, the modulus of the magnetization varied as the cosine of the angle $\Phi$ of reference of the block with respect to the plane x O z. This angle $\Phi$ is the angle of the radial median plane of the block with the plane x O z. Since the blocks are contiguous, equal and with a same number $n_b$ per section, the positioning angle is equal to $k2\pi/n_b$ (k whole number).

In this first configuration, where the direction of magnetization is always radial, the directions of magnetization of the different blocks have a radial aspect which is divergent on one side (to the right) and convergent on the other side, to the left. In the block 10, as well as in the blocks 19 to 22 (it is the same thing in each section), the magnetization should be nominal. In the blocks such as 9 and 11, it is reduced; it is even more so in the blocks 8 and 12. On the blocks 7 and 13, the magnetization should be null, since the positioning angle is equal to 90°. In this case, it suffices not to position blocks 7 and 13. This has the advantage, on the one hand, of reducing the cost of the structure and, on the other hand, of making a equipment entrance from the top and/or the bottom of a magnet of this type. In the preferred embodiment shown in FIG. 1, there are 12 blocks per section, of which two blocks are fictitious. These blocks have magnetizations which are respectively nominal (in the blocks 10 and 16), proportionate to $\sqrt{3}/2$ times the nominal magnetization (in the blocks 9, 11, 15, 17), to half of the nominal magnetization (in the blocks 8, 12, 14, 18), and to O (in the blocks 7 and 13).

In a structure which is a counterpart of the preceding one (shown with the same dimensions by FIG. 1b) the magnetization is tangential to the cylinder. Its value is proportionate to the sine of the angle $\Phi$ of reference of the blocks. The field lines of magnetization follow the reverse trigonometric direction in the blocks 15, 14, 13, 12 and 11, and follow the trigonometric direction in the blocks 17, 18, 7, 8 and 9. The magnetization is nominal in modulus in the blocks 7 and 13, it is null in the blocks 16 and 10. In this configuration, the equipment entrance into the magnet, in addition to the main longitudinal entrance, can be achieved by the blocks 16 and 10 which are not present.

It is possible to accomplish one of the two solutions at choice. However, all of magnets, including the permanent magnets, should preferably have a null dipole moment. If this is not so, it becomes difficult to approach a control desk provided with a display panel and cathode ray tube screen in the immediate environment of the magnet. It is well known that the indications displayed on this screen are distorted because of the external magnetic field of the magnet. This moreover, prohibits the use of color display panels. To avoid this problem, the control desk should be far away from the magnet and, hence, an operator directing an NMR experiment is obligatorily far from the patient who undergoes an examination such as this. This is rather harmful to the psychological comfort of this patient. Moreover, practitioners who possess cardiac assistance machines sensitive to the spurious induction fields cannot perform NMR experiments. In order to create a weak, spurious field external to the magnet (it is said that the magnet has a null total dipole moment), the two corresponding structures can be combined together.

To this end, it is possible to make two concentric structures, one with radial magnetization, the other with tangential magnetization. In a preferred way, a variegated structure, which is described further below, is made. It has been discovered that a variegated solution requires each solution to take part in the variegation with magnetizations in each of the rings respectively proportionate to $a_1 \cos \Phi$ and to $a_2 \sin \Phi$ times a nominal magnetization common to both solutions. In this case, $a_1$ and $a_2$ should be such that $(a_1)^2 + (a_2)^2$ is smaller than or equal to 1. Furthermore, the null dipole moment is obtained when $a_1$ is equal to $a_2$. The resolution of these two equations indicates that, in taking proportions $a_1$ and $a_2$ equal to $1/\sqrt{2}$, we obtain the maximum intensity of the induction field compatible with a null dipole moment. If, for each of the three solutions (sine, cosine, variegated), we choose the same materials, capable therefore of having one and the same nominal magnetization, the solutions leading to the smallest mass of material to achieve a given field, in a given volume, are, in a substantially equivalent way, the cosine solution and the variegated solution. This variegated solution further has the advantage of leading to a null dipole moment, but also causes the benefit of equipment entrance perpendicular to the axis to be lost. The sine solution is appreciably more unwieldy.

The choice of the orientation of the radial or tangential magnetization resolves, as recalled previously, the problem of the magnetization of the blocks. In effect, the blocks are always magnetized according to their structure and orientations (and not with any orientations with respect to these structural orientations). FIG. 2 shows how it is further possible in another way to resolve the problem of the oblique cutting of the magnetic blocks of FIG. 1. In FIG. 1, the magnetic blocks have a trapezoidal section. The distance from the small bases and the large bases of the trapezoids to the axis z of the cylinder contribute to determining, with the value of the nominal magnetization, the value of the induction $B_0$. In FIG. 2, the trapezoidal sections have been replaced by rectangular sections, one side of which is equal to the small base of the trapezoid. The loss of contribution to magnetization, provided by the lateral triangular sections of the trapezoids, is compensated for by a increase in correspondence of the thickness of the blocks measured radially to the cylinder. The blocks 100 and 190 to 220 respectively replace the blocks 10 and 19 to 22 of FIGS. 1a and 1B. However, if non-parallelepiped blocks are used, it is appropriate to perform the oblique cutting before magnetization.

FIGS. 3 to 6 show the different steps of a general method of construction of a magnet according to the invention. One of the first problems to be resolved consists in having to magnetize the blocks with a magnetization for which the modulus can be set. FIG. 3 shows that this result is achieved simply by attaching plates (bar could also be placed) made of magnetic materials 23 to plates 24 made of non-magnetic material. The proportion of the magnetic material with respect to the general volume is adjusted by bringing into play the thickness $e_1$ of the magnetic plates with respect to the thickness $e_2$ of the non-magnetic plates. It can be easily shown that the macroscopically equivalent magnetization of a block thus made is equal to the product of the intrinsic magnetization of the parts made of magnetic materials by the proportion ($e_1/(e_1+e_2)$) of these magnetic materials in the whole. Failing the availability of plates 23 of adequate dimension, it is also possible to use slabs 25 to 27, of permanently magnetizable materials, that are joined end to end with one another with a very fine contact, and in such a way that their magnetic anisotropy A is aligned and continuous, on the one hand, with one another and, on the other hand, with the magnetization direction subsequently imposed on the blocks. The brick thus formed is of standard dimension. It is calculated to be capable of being magnetized in a standard magnetizer such as the magnetizer 28 of FIG. 4. The current I which flows through this magnetizer has to be strong enough, and produce sufficiently great excitation, for all the parts, made of magnetizable materials, of the brick to be brought to their saturation magnetization. If this saturation magnetization is called $M_s$, the brick will be magnetized with a value macroscopically equal to the product of $M_s$ by the proportion of magnetic material.

The magnetized bricks are then assembled to form the magnetized blocks described above now. In the approach using variegated magnetization, the blocks comprise, juxtaposed with one another, bricks magnetized orthogonally to one another. For example, a block 29 in FIG. 5 comprises radial magnetization bricks 30 to 32 that are juxtaposed, or even stacked, on bricks 33 to 35 with tangential magnetization. The assembling of the bricks in the blocks can be done in the same way as the assembling of the plates or of the slabs in the bricks: i.e. with epoxy resin based bonders. The blocks formed are then placed in a crown 36 made of epoxy resin. If they are rectangular, they are separated from one another by wedge-shaped shims such as 37. In case of need, another crown (not shown) opposite the crown 36 may hold the blocks in a sandwich to ensure the rigidity of the annular section. During assembly, the crowns are housed (FIG. 6) in cradles such as 38 on which they may lie by all their lower parts. In a preferred way, the cradles 38 and the crowns 36 are provided with means to ensure a slight rotation or a slight shift, in one direction or in the other, in the crowns. For example, a threaded rod 39, lying on the cradle 38, may be screwed into a pommel 40, solidly joined to the crown, and may cause the rotation of this crown when the rod is turned. In this way, a simple means is available to make on-site corrections, at an industrial level, in the homogeneity of the magnet built.

It is possible to give an analytic expression of the value of the field $B_0$ as a function of the coordinates of the location of the space where this field prevails. In particular, if the field $B_0$ is oriented in parallel to the axis x, this value can be expressed in a series of polynomial terms in x, y, z, of increasing power. The coefficients which weight each of these terms may be assigned to an order equal to the power of the concerned polynomial in x, y and z. It is known that the homogeneity of the field $B_0$ obtained is all the higher as the coefficients may be considered to be null up to an order which is the highest possible. It is said that a field is homogeneous to an order h, if all the polynomial terms of power smaller than or equal to h have a null coefficient. In the invention, it was realized that, for a given order h, there was a minimum number of sections and a minimum number of blocks for which this homogeneity was achieved. It was further realized that this optimum is also applicable to a magnetization structure like that indicated in the state of the art cited. It was thus discovered that the number of sections $n_a$ had to be such that:

$n_a$ greater than or equal to $(h+1)/2$

As for the number of blocks per section $n_b$, it should be such that:

$n_b$ greater than or equal to $(h+3)$.

This leads to the following conclusions. Firstly, the optimization advocated by the invention proposes a minimum structure, namely one where the number of blocks to be made ultimately is the smallest possible to obtain homogeneity to a given order. This minimum structure is such that:

$n_b = 2(n_a + 1)$

That is, a number of blocks equal to twice the number of sections plus one. It will be observed, to this effect, that the magnetization represented up to now is optimum from the viewpoint of homogeneity for it comprises five sections ($n_a = 5$) and twelve blocks per section ($n_b = 12 = 2(5+1)$). It is homogeneous to the order 9, namely that the polynomials of the lowest degree taking part in the development of its field, are of degree 10. Thus the number of blocks to be manipulated is small, which facilitates the fabrication and setting of the magnet. Secondly, the installation and setting of the crowns will be as delicate as the fabrication of the blocks and the crowns is relatively easy. Hence, and in a preferred way, it is seen to it that the homogeneity sought is met with a minimum number of crowns but, on the other hand, it is possible to position a number of blocks greater than that necessary. Ultimately, in the case of a variegated structure, the most used industrial solution is such that the number of blocks per section is greater than or equal to the number of sections plus one. On the other hand, the solution that leads to the biggest lateral equipment openings in the case of a non-variegated structure, is that where the blocks are the biggest and where their number is therefore minimal.

In a preferred way, the magnetic materials used are either ferrites, of strontium or barium, or alloys of samarium-cobalt or alloys of iron-neodymium-boron. These different materials have intrinsic remanent magnetizations with different saturations. Besides, they have different volume mass and price. It is possible to choose in this way, depending on the different specifications of the induction field to be produced, that solution which is the most adapted one. The principle of computation of the internal and external radii of the annular sections, as well as of the heights of these sections, is the same in the case of the invention as that leading to the determination of blocks in the state of the art referred to. It is noted, however, that for constant internal and external radii, irrespectively of the section, the thickness of these sections along the axis should be increased with distance from the center of the zone of interest of the magnet. This appears particularly in FIGS. 1 and 2.

I claim:

1. Cylindrical permanent magnet (1) to produce a uniform and transversal (x) induction field ($B_0$), of the type comprising magnetized blocks (7-18) with a permanent magnetization, distributed in annular sections (2-6) arranged along the cylinder, and distributed on the rim of each section, characterized in that the magnetization, in the blocks, is oriented at least partially tangentially in each block with respect to the cylinder and in that the blocks are mounted on crowns (36) which are mobile (39, 40) to correct the homogeneity of the magnet.

2. Cylindrical permanent magnet (1) to produce a uniform and transversal (x) induction field ($B_0$), of the type comprising magnetized blocks (7-18) with a permanent magnetization, distributed in annular sections (2-6) arranged along the cylinder, and distributed on the rim of each section, characterized in that the magnetization, in the blocks, is oriented at least partially tangentially in each block with respect to the cylinder and in that it comprises a number $n_a$ of magnetized sections stacked on one another along the axis of the cylinder, each section comprising $n_b$ blocks and wherein the induced field is homogeneous to an order h if $n_a$ is greater than (h+1)/2 and if $n_b$ is greater than (h+3).

3. Magnet according to any of claims 2 or 1 or, characterized in that the magnetization is also partially radial and in that the modulus of this radial magnetization varies from one block to another as the cosine of the positioning angle ($\Phi$) which links the direction of the transversal field to the aximuth of this block.

4. Magnet according to any of claims 2 or 1, characterized in that the magnetization is at least partially tangential and in that modulus of this tangential magnetization varies from one block to another as the sine of the positioning angle ($\Phi$) which links the direction of the transversal field to the azimuth.

5. Magnet according to claim 1, characterized in that the number of blocks per section $n_b$ is at least twice the number of sections $n_a$ plus 1.

6. Magnet according to claim 5, characterized in the $n_b$ is equal to $2(n_a+1)$ (FIG. 1-2).

7. Magnet according to claim 2, characterized in that $n_a$ equals 5, in that $n_b$ equals 12 and in that the field is uniform to the order 9.

8. Cylindrical permanent magnet (1) to produce a uniform and transversal (x) induction field ($B_0$), of the type comprising magnetized blocks (7-18) with a permanent magnetization, distributed in annular sections (2-6) arranged along the cylinder, and distributed on the rim of each section, characterized in that the magnetization, in the blocks, is oriented at least partially tangentially in each block with respect to the cylinder and in that the thickness of the annular sections, measured in parallel to the axis of the cylinder, increases with distance from the center of the magnet.

9. Cylindrical permanent magnet to produce a uniform and transversal induction field of the type comprising magnetized blocks with a permanent magnetization distributed in a number $n_a$ of annular sections arranged along the cylinder and distributed on the rim of each section in a number $n_b$ of blocks characterized in that $n_b$ is at least $2(n_a+1)$ and in that the thickness of the annular sections, measured in parallel to the axis of the cylinder, increases from the center of the magnet.

10. Cylindrical permanent magnet to produce a uniform and transversal induction field of the type comprising magnetized blocks with a permanent magnetization distributed in a number $n_a$ of annular sections arranged along the cylinder and distributed on the rim of each section in a number $n_b$ of blocks characterized in that $n_b$ is greater than or equal to $2(n_a+1)$ and in that it is homogeneous to an order h if at least one of first and second conditions is satisfied, wherein said first condition is satisfied if $n_a$ is greater than (h+1)/2 and said second condition is satisfied if $n_b$ is greater than (h+3).

11. Magnet according to claim 10, characterized in that the thickness of the annular sections, measured in parallel to the axis of the cylinder, increases with distance from the center of the magnet.

12. Magnet according to claim 2, characterized in that the magnetization is at least partially tangential and in that the modulus of this tangential magnetization varies from one block to another as the sine of the positioning angle $\Phi$ which links the direction of the transversal field to the azimuth.

13. Magnet according to claim 2, characterized in that the blocks comprise bricks with radial magnetization and bricks with tangential magnetization.

14. Magnet according to claim 13, characterized in that, in each block, the bricks with radial magnetization and the bricks with tangential magnetization are in equal proportion to form a magnet with a null dipole moment.

15. Magnet according to claim 3, characterized in that the blocks comprise bricks (30-32) with radial magnetization and bricks (33-35) with tangential magnetization.

16. Magnet according to claim 15, characterized in that, in each block, the bricks with radial magnetization and the bricks with tangential magnetization are in equal proportion to form a magnet with a null dipole moment.

* * * * *